United States Patent
Harada et al.

(10) Patent No.: US 8,222,744 B2
(45) Date of Patent: Jul. 17, 2012

(54) SEMICONDUCTOR DEVICE AND MANUFACTURING METHOD OF THE SEMICONDUCTOR DEVICE

(75) Inventors: Yoshimichi Harada, Kanagawa (JP); Makoto Murai, Oita (JP); Takayuki Tanaka, Oita (JP); Takuya Nakamura, Kanagawa (JP)

(73) Assignee: Sony Corporation, Tokyo (JP)

( * ) Notice: Subject to any disclaimer, the term of this patent is extended or adjusted under 35 U.S.C. 154(b) by 282 days.

(21) Appl. No.: 12/688,029

(22) Filed: Jan. 15, 2010

(65) Prior Publication Data
US 2010/0181680 A1 Jul. 22, 2010

(30) Foreign Application Priority Data

Jan. 21, 2009 (JP) ................. 2009-010786

(51) Int. Cl.
*H01L 23/48* (2006.01)
*H01L 21/00* (2006.01)

(52) U.S. Cl. ............... 257/773; 257/788; 257/E23.129; 257/E21.503; 438/124

(58) Field of Classification Search ........... 257/E23.129, 257/773, 788, E21.503; 438/124
See application file for complete search history.

(56) References Cited

U.S. PATENT DOCUMENTS

| | | | | |
|---|---|---|---|---|
| 2002/0092162 A1* | 7/2002 | Tsai et al. | ........................ | 29/840 |
| 2004/0043534 A1* | 3/2004 | Yamashita | ..................... | 438/108 |
| 2006/0046352 A1* | 3/2006 | Low et al. | ..................... | 438/127 |
| 2008/0017983 A1* | 1/2008 | Tzeng et al. | .................. | 257/737 |
| 2011/0175239 A1* | 7/2011 | Harada et al. | .................. | 257/782 |

FOREIGN PATENT DOCUMENTS

JP      2005-276879      10/2005

\* cited by examiner

*Primary Examiner* — Lex Malsawma
(74) *Attorney, Agent, or Firm* — SNR Denton US LLP

(57) ABSTRACT

A semiconductor device includes: a mounted body in which a wiring pattern is formed on a first main surface; a semiconductor chip mounted on the surface of the mounted body on which the wiring pattern is formed; an underfill material which is filled between the mounted body and the semiconductor chip and forms a fillet on an outer peripheral part of the semiconductor chip; and an injection section which is disposed on the mounted body and on an outside of a side section, on which the fillet is formed to be longest, of four side sections defining a chip mount area on which the semiconductor chip is mounted, and guides the underfill material to between the mounted body and the semiconductor chip.

10 Claims, 13 Drawing Sheets

PLAN VIEW

SIDE SECTIONAL VIEW

PLAN VIEW

SIDE SECTIONAL VIEW

PLAN VIEW

SIDE SECTIONAL VIEW

FIG.22A WHOLE PLAN VIEW

FIG.22B ENLARGED PLAN VIEW

FIG.22C ENLARGED SIDE SECTIONAL VIEW

SEMICONDUCTOR DEVICE AND MANUFACTURING METHOD OF THE SEMICONDUCTOR DEVICE

BACKGROUND OF THE INVENTION

1. Field of the Invention

The present invention relates to a semiconductor device and a manufacturing method of the semiconductor device. More particularly, the present invention relates to a semiconductor device having a structure in which a semiconductor chip is mounted on a mounted body and a manufacturing method of the same.

2. Description of the Related Art

With improvement in integration, performance and function of LSIs, problems such as reduction in yield, increase in mounting area, and increase in cost become serious. In recent years, attention is paid to SiP (System in Package) in which both these problems and the LSI performance can be managed. The SiP can be classified into various structures such as a package lamination type, a chip stack type, and a chip-on-chip type, and particularly, the chip-on-chip type is advantageous in speedup and reduction in consumed electric power since chips can be multi-pin connected to each other with short wiring length.

The chip-on-chip type SiP is realized in such a way that for example, a memory chip and a logical circuit chip are connected to each other through micro bumps formed on the chip while the active surfaces of the chips are made to face each other face to face.

In general, in the chip-on-chip type SiP, a liquid resin called an underfill material is filled between the chips connected through the bumps in order to protect the bumps. The underfill material is filled between the chips by, for example, a method as shown in FIG. 19 (see, for example, JP-A-2005-276879 (patent document 1)). That is, a first semiconductor chip 1 and a second semiconductor chip 2 (including a not-shown diffusion layer, transistor, wiring layer, etc.) mounted thereon are connected to each other through bumps 3, and in this state, an underfill material 5 is supplied by using a needle 4. At this time, the underfill material 5 is dropped to the surface of the first semiconductor chip 1 in the vicinity of the second semiconductor chip 2. Then, the underfill material 5 wets and spreads on the surface of the first semiconductor chip 1, reaches the end of the second semiconductor chip 2, and penetrates a gap between the chips by a capillary phenomenon. Besides, as shown in FIGS. 20A and 20B, the underfill material 5 penetrated by the capillary phenomenon forms a fillet 6 with a wide bottom on the outer periphery of the second semiconductor chip 2. Thereafter, the underfill material 5 is hardened by heat treatment. By this, crack of the bumps 3 due to stress concentration is prevented, the influence of an external stress such as moisture absorption is reduced, and the connection reliability between the upper and lower chips is ensured.

SUMMARY OF THE INVENTION

The filling process of the underfill material is performed by using following phenomena (1) to (3)

(1) Drop of the underfill material 5.

(2) The phenomenon in which the dropped underfill material 5 wets and spreads on the surface of the first semiconductor chip 1.

(3) The phenomenon in which the wetting and spreading underfill material 5 penetrates a gap between the chips by the capillary phenomenon.

At that time, in order to cause the underfill material 5 to penetrate without generating a void (air bubble) in the gap between the chips, it is desirable that the wet spread property of the surface of the first semiconductor chip 1 is high, that is, the surface tension is small. Besides, in order to cause the underfill material 5 to uniformly and voidlessly penetrate, it is desirable that there is no portion where the wet spread property is partially bad.

On the other hand, according to a pattern of an LSI, as shown in FIG. 21, a stepped portion 9 is formed on the surface of the first semiconductor chip 1 by a passivation film 8 covering a wiring pattern 7 of the uppermost layer of the LSI. Particularly, as shown in FIGS. 22A, 22B and 22C, when the uppermost wiring pattern 7 is formed perpendicularly to a penetration direction Y of the underfill material 5, the stepped portion 9 of the passivation film 8 is formed in parallel to the wiring pattern 7. Thus, the fluidity of the underfill material 5 is blocked by the surface tension of the passivation film 8 at the stepped portion 9. Accordingly, for example, the speed at which the underfill material 5 reaches the end of the second semiconductor chip 2 or the amount thereof varies for each chip due to manufacture variation of the first semiconductor chip 1. As a result, for example, as shown in FIG. 23, a void 11 is generated in the gap between the upper and lower chips, and the reliability of the connection part is degraded.

Besides, when the fluidity of the underfill material 5 is blocked, in the filling process, the balance between (1) to (3) is lost. Thus, for example, as compared with the underfill material 5 which wets and spreads on the surface of the first semiconductor chip 1, or the underfill material 5 which penetrates the gap between the chips, there is a case where the amount of the underfill material 5 dropped from the needle 4 becomes excessive. In such a case, as shown in FIG. 23, the climbing (creeping) 12 of the underfill material 5 occurs onto the second semiconductor chip 2 in the vicinity of a supply area 10. As a result, the void 11 is generated in the gap between the upper and lower chips in which the underfill material 5 is originally to be filled, and there is a problem that the reliability of the connection part is degraded. Besides, there is also a problem that insufficient filling of the underfill material 5 occurs due to the occurrence of the climbing 12.

Especially, in recent years, because of improvement in integration technique of LSI and a request for miniaturization, further miniaturization of the first semiconductor chip 1 is studied in the chip-on-chip type semiconductor device (SiP). Thus, even when a defined amount of the underfill material 5 is supplied in accordance with the chip size of the second semiconductor chip 2, it is necessary that the supply area 10 is set to be close to the second semiconductor chip 2. As a result, for example, the capillary force acts between the end face of the second semiconductor chip 2 and the needle 4, and there occurs a state where the climbing 12 is more liable to occur.

Besides, in recent years, a lamination technique of chips is developed, and three or more semiconductor chips (LSI chips, etc.) are often stacked and contained in one package. As stated above, in the chip-on-chip structure, when a not-shown third semiconductor chip is laminated on the second semiconductor chip 2 mounted on the first semiconductor chip 1, the climbing 12 of the underfill material 5 becomes an obstruction. Specifically, as shown in FIG. 24, when the climbing 12 of the underfill material 5 occurs, the attitude of the third semiconductor chip 13 laminated thereon is inclined, or the adhesion between the chips is deteriorated. Besides, when the resin sealing of the chips including the laminated third semiconductor chip 13 is performed, the resin thickness on the third semiconductor chip 13 varies, and the insufficient filling of the resin may occur. Thus, the yield or reliability is reduced.

Thus, it is desirable to provide a semiconductor device having a structure in which a semiconductor chip is mounted on a mounted body, and the climbing of an underfill material onto the semiconductor chip and the occurrence of voids can be prevented, and a manufacturing method of the same.

According to an embodiment of the present invention, there is provided a semiconductor device including a mounted body in which a wiring pattern is formed on a first main surface, a semiconductor chip mounted on the surface of the mounted body on which the wiring pattern is formed, and an underfill material which is filled between the mounted body and the semiconductor chip and forms a fillet on an outer peripheral part of the semiconductor chip, and an injection section to guide the underfill material to between the mounted body and the semiconductor chip is formed on the mounted body and on an outside of a side section, on which the fillet is formed to be longest, of four side sections defining a chip mount area on which the semiconductor chip is mounted.

In the semiconductor device of the embodiment of the invention, the underfill material supplied onto the mounted body in the manufacturing process of the semiconductor device is guided to the side section (chip end) of the semiconductor chip through the injection section. Besides, the underfill material reaching the side section of the semiconductor chip penetrates between the mounted body and the semiconductor chip by the capillary phenomenon, and forms the fillet on the outer peripheral part of the semiconductor chip.

According to another embodiment of the invention, there is provided a manufacturing method of a semiconductor device including the steps of mounting a semiconductor chip on a mounted body in which a wiring pattern is formed on a first main surface, and filling an underfill material between the mounted body and the semiconductor chip to form a fillet on an outer peripheral part of the semiconductor chip, and before the mounting step, an injection section is formed on the mounted body and on an outside of a side section, which is closest to a supply area where the underfill material is supplied, of four side sections defining a chip mount area on which the semiconductor chip is mounted, and in the filling step, the underfill material is guided to between the mounted body and the semiconductor chip by using the injection section.

In the manufacturing method of the semiconductor device according to the embodiment of the invention, after the mounting step is performed, in order to fill the underfill material between the mounted body and the semiconductor chip, the underfill material is supplied to the supply area on the mounted body. Then, the underfill material is guided to the side section (chip end) of the semiconductor chip through the injection section on the mounted body. Besides, the underfill material reaching the side section of the semiconductor chip penetrates between the mounted body and the semiconductor chip by the capillary phenomenon, and forms the fillet on the outer peripheral part of the semiconductor chip.

According to the embodiments of the invention, in the semiconductor device having the structure in which the semiconductor chip is mounted on the mounted body, the climbing of the underfill material onto the semiconductor chip and the occurrence of voids can be prevented. Thus, the connection reliability of the semiconductor device and the yield can be improved.

DESCRIPTION OF PREFERRED EMBODIMENTS

Figure 1A:
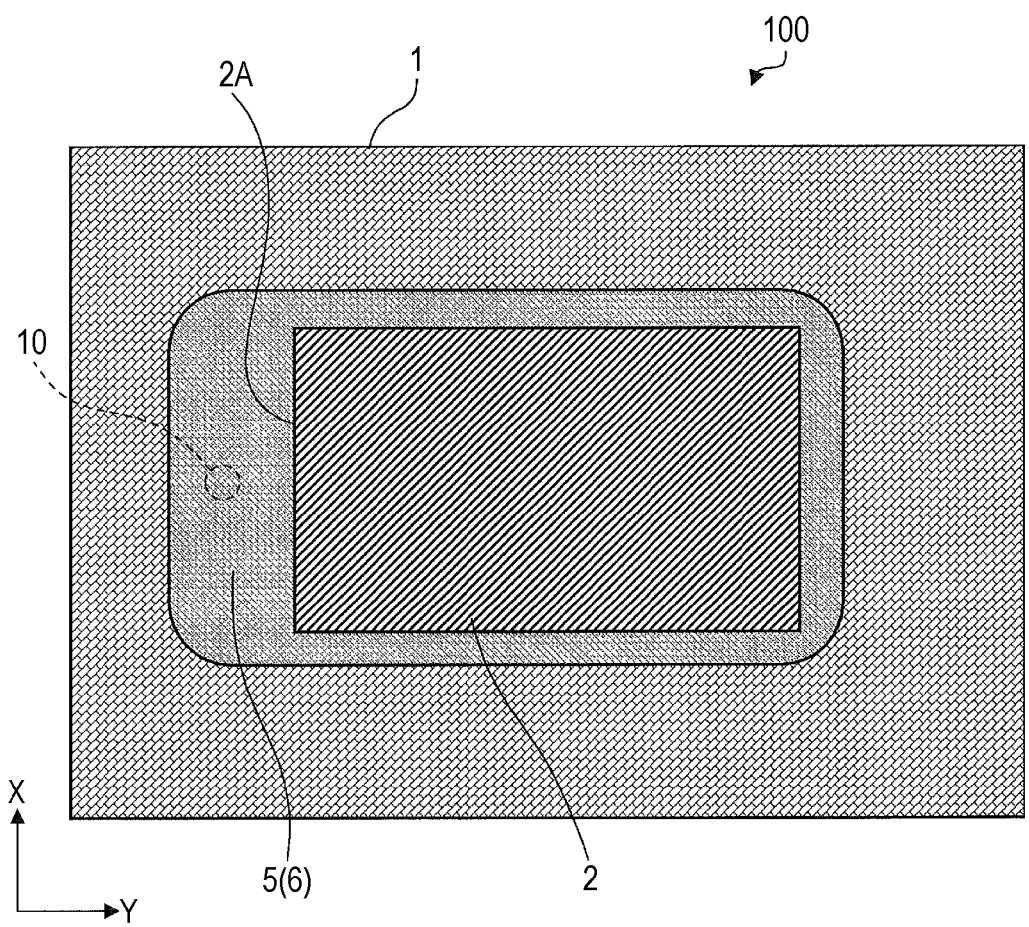
FIGS. 1A and 1B are views showing a structure of a semiconductor device according to an embodiment of the invention.

Hereinafter, specific embodiments of the present invention will be described in detail with reference to the drawings. Incidentally, the technical scope of the invention is not limited to the embodiments described below, and includes modes in which various modifications and improvements are made within the scope in which specific effects obtained by the components of the invention and the combination thereof can be obtained.

The embodiments of the invention will be described in the following order. Besides, in the embodiments, the same portions as those of FIG. 19 to FIG. 24 are denoted by the same reference numerals and their description is made.

1. Structure of the semiconductor device
2. First embodiment
3. Second embodiment
4. Third embodiment
5. Fourth embodiment
6. Fifth embodiment
7. Sixth embodiment
8. Seventh embodiment
9. Eighth embodiment
10. Ninth embodiment

1. Structure of the Semiconductor Device

Figure 1B:
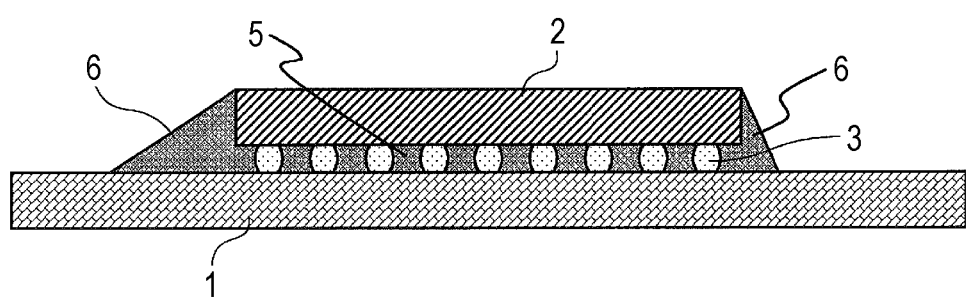

FIGS. 1A and 1B are views showing a structure of a semiconductor device according to an embodiment of the invention. An illustrated semiconductor device 100 includes a first semiconductor chip 1 and a second semiconductor chip 2. Each of the semiconductor chips 1 and 2 may have any function. For example, one of the semiconductor chips may be a memory chip, and the other of the semiconductor chips may be a logical circuit chip or may have a function other than that. Besides, here, although the description will be made while using, as an example, a chip-on-chip semiconductor device in which the first semiconductor chip 1 is a mounted body, the invention is not limited to this, and a not-shown wiring substrate (for example, silicon interposer substrate, etc.) may be made the mounted body.

Each of the first semiconductor chip 1 and the second semiconductor chip 2 is formed into a quadrangle (rectangle, square, etc.) when viewed in plane. The first semiconductor chip 1 has an outer size larger than the second semiconductor chip 2. A not-shown semiconductor device (for example, a transistor, etc.) is formed on a main surface of the first semiconductor chip 1, and a not-shown semiconductor device is formed also on a main surface of the second semiconductor chip 2. The first semiconductor chip 1 and the second semiconductor chip 2 are electrically and mechanically connected to each other through bumps 3 in a state where the main surfaces (device formation surfaces) face each other. The bumps 3 are formed by using, for example, solder bumps made of Sn (tin)-Ag (silver) alloy.

Figure 2:
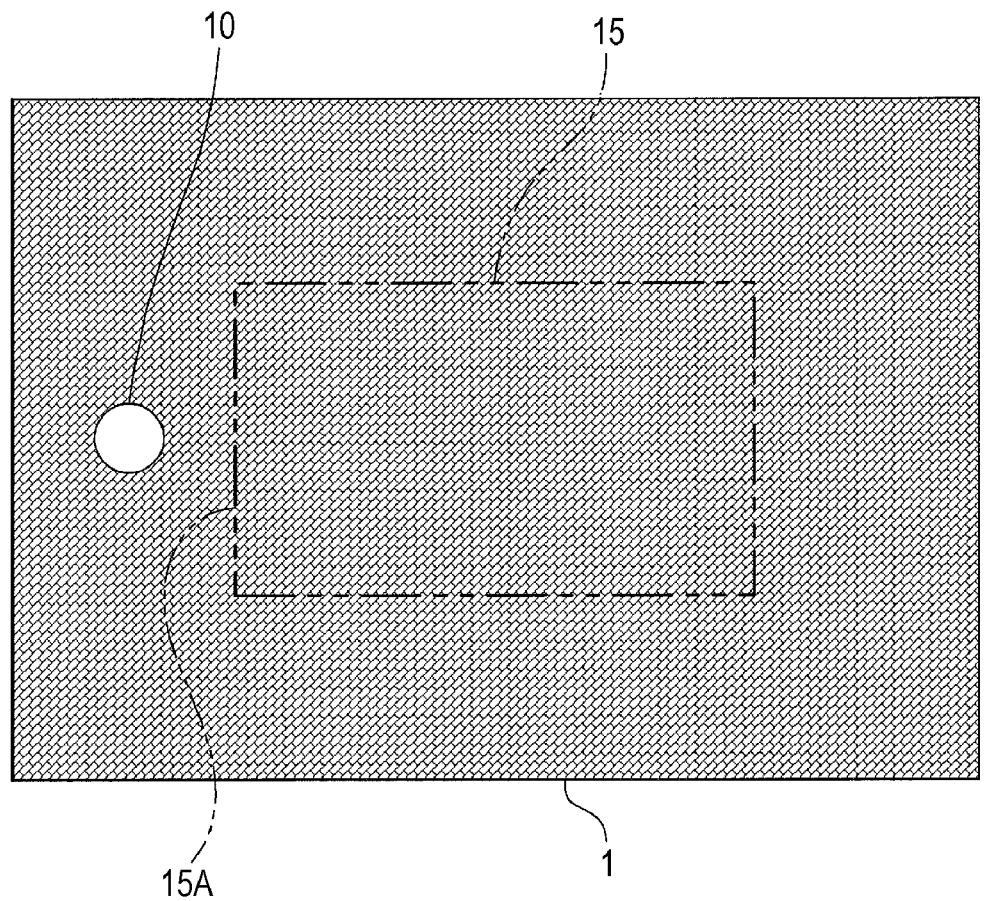
FIG. 2 is a plan view showing positions of a supply area of an underfill material and a chip mount area which are set on a first semiconductor chip.

The second semiconductor chip 2 is mounted on the first semiconductor chip 1. As shown in a plan view of FIG. 2, a chip mount area 15 for mounting the second semiconductor chip 2 is set on the main surface (device formation surface) of the first semiconductor chip 1. The chip mount area 15 is set at, for example, the center of the device formation surface of the first semiconductor chip 1. The second semiconductor chip 2 is positioned in conformity with the chip mount area 15 and is mounted on the first semiconductor chip 1.

An underfill material 5 is filled between the first semiconductor chip 1 and the second semiconductor chip 2. The underfill material 5 is filled in a portion where the first semiconductor chip 1 and the second semiconductor chip 2 face each other. The underfill material 5 is provided for the purpose of preventing crack of the bumps 3 due to stress concentration, reducing the influence of external stress such as moisture absorption, mechanically protecting the bumps 3, and preventing an electrical short due to melting of a solder material forming the bumps 3. The underfill material 5 is formed by using, for example, a thermosetting resin such as an epoxy resin.

The underfill material 5 forms a fillet 6 on the outer peripheral part of the second semiconductor chip 2. The fillet 6 is formed to widen toward the bottom from four side sections defining the outer peripheral part of the second semiconductor chip 2 in a state where the fillet covers the end faces of the second semiconductor chip 2. When the lengths of the fillet 6 at the four side sections of the second semiconductor chip 2 are compared with each other, the length of the fillet 6 formed at a side section 2A closest to the supply area 10 where the underfill material 5 is supplied onto the first semiconductor chip 1 in the manufacturing process of the semiconductor device 100 is longest. This is because, on the side section 2A of the second semiconductor chip 2 closest to the supply area 10 of the underfill material 5, the underfill material 5 wets and spreads on the first semiconductor chip 1 from the start point of the supply area 10, and the fillet 6 is formed in the wider range than the other side section. The length of the fillet 6 is defined as the size from the side section of the second semiconductor chip 2 to the end of the fillet when the semiconductor device 100 is viewed in plane.

Figure 3:
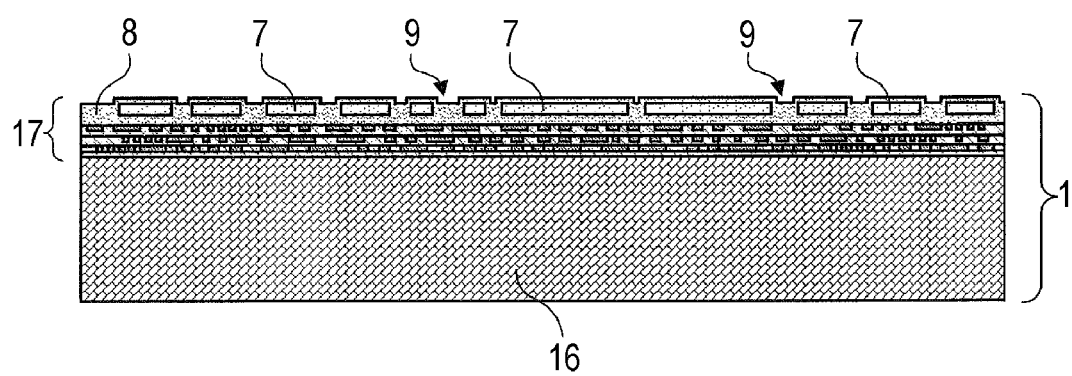
FIG. 3 is a sectional view of the first semiconductor chip.

FIG. 3 is a sectional view of the first semiconductor chip 1. The first semiconductor chip 1 includes, as a base, a semiconductor substrate 16 such as, for example, a silicon substrate. A multi-layer wiring layer 17 including plural wiring layers is formed on the main surface side of the semiconductor substrate 16. The multi-layer wiring layer 17 is formed by laminating, for example, a wiring layer using a wiring material such as copper or aluminum and an inter-layer insulating layer using an insulating material such as silicon oxide or silicon nitride. The wiring pattern of a wiring layer formed on a layer lower than the uppermost layer of the multi-layer wiring layer 17 is formed by using, for example, copper as a wiring material. On the other hand, the wiring pattern 7 of the wiring layer formed on the uppermost layer of the multi-layer wiring layer 17 is formed by using, for example, aluminum or alloy mainly containing aluminum (alloy in which a trace amount of copper is mixed in aluminum) as a wiring material. The wiring pattern 7 is formed on a surface part of the first semiconductor chip 1. Besides, the wiring pattern 7 is formed under the condition of, for example, a wiring width of 30 µm, a gap of 4 µm between wirings, and a wiring thickness of 1.1 µm.

The wiring pattern 7 is covered with a passivation film 8. The passivation film 8 is formed of, for example, a lamination film in which a silicon oxide film and a silicon nitride film are laminated. The passivation film 8 is formed of a lamination film of, for example, a silicon oxide film with a thickness of 500 nm and a silicon nitride film with a thickness of 700 nm.

A stepped portion 9 is formed on the surface of the passivation film 8 correspondingly to the formation position of the wiring pattern 7. The stepped portion 9 is formed in the plane of the first semiconductor chip 1 in such a way that the passivation film 8 is convexed at the formation part of the wiring pattern 7, and the passivation film 8 is concaved between the wiring patterns 7.

2. First Embodiment

Figure 4:
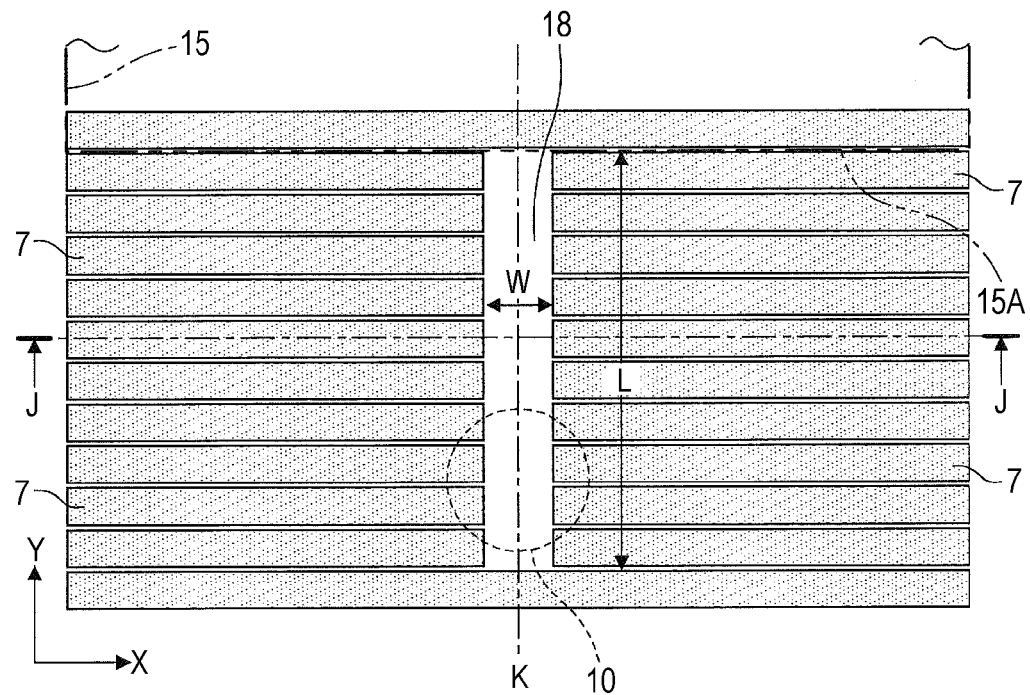
FIG. 4 is a plan view showing a structure of a semiconductor device of a first embodiment of the invention, in which a part of a device formation surface of a first semiconductor chip before a second semiconductor chip is mounted is enlarged.
Figure 5:
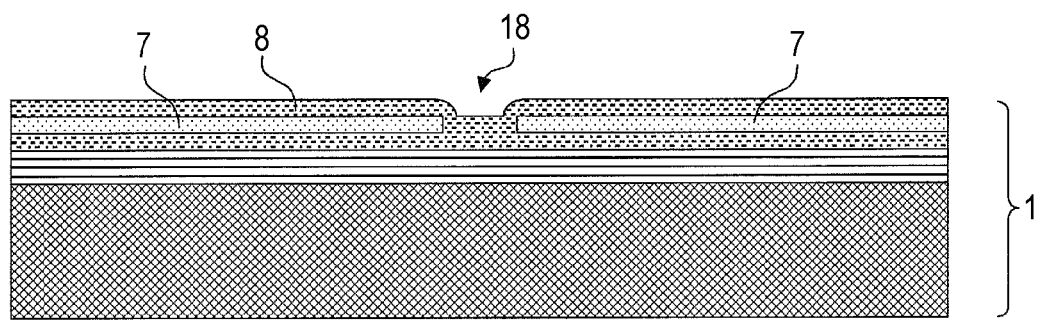
FIG. 5 is a J-J sectional view of FIG. 4.

FIG. 4 is a plan view showing a structure of a semiconductor device of a first embodiment of the invention, in which a part of a device formation surface of a first semiconductor chip 1 before a second semiconductor chip 2 is mounted is enlarged. FIG. 5 is a J-J sectional view of FIG. 4. As shown in the drawings, a chip mount area 15 is set in the device formation surface of the first semiconductor chip 1. The chip mount area 15 is defined in conformity to the outer shape of the second semiconductor chip 2 and is formed into a quadrangle when viewed in plane. A supply area 10 of an underfill material is set in the vicinity of one side section 15A of four side sections defining the chip mount area 15. Plural wiring patterns 7 are formed in a direction parallel to the side section 15A of the chip mount area 15 and on the inside and the outside of the chip mount area 15. The respective wiring patterns 7 form the wiring layer of the uppermost layer of the multi-layer wiring layer 17. The supply area 10 of the underfill material is set at a position spaced by a specified distance from the side section 15A of the chip mount area 15 to the chip end side of the first semiconductor chip 1. When the underfill material is dropped and supplied from a needle 4 of a dispenser, the specified distance is set to a size larger than at least the outer diameter size of the needle 4. Thus, the underfill material 5 supplied to the supply area 10 penetrates a gap between the chips by the capillary phenomenon from the side section 2A of the second semiconductor chip 2 fitted to the side section 15A of the chip mount area 15 and mounted.

Here, a wiring direction (length direction) of the wiring pattern 7 is defined as an X direction, and a direction orthogonal to the X direction in the plane of the first semiconductor chip 1 is defined as a Y direction. In that case, the underfill material 5 supplied to the supply area 10 flows in the Y direction when viewed from the supply area 10, reaches the side section 2A of the second semiconductor chip 2, and penetrates between the chips from there. On the other hand, an injection section 18 is provided on the device formation surface of the first semiconductor chip 1 so as to extend in the Y direction. The injection section 18 is formed in order to guide the underfill material, which is supplied to the supply area 10 on the first semiconductor chip 1 in the manufacturing process of the semiconductor device 100, to between the first semiconductor chip 1 and the second semiconductor chip 2. The injection section 18 is formed on the outside of the side section 15A on which the fillet 6 is formed to be longest among the four side sections defining the chip mount area 15. The outside of the side section 15A here includes a position planarly overlapping with the side section 15, and is an area on the chip end side of the first semiconductor chip 1 and extending to the fillet end when viewed from the side section 15A.

In the state where the second semiconductor chip 2 is mounted on the first semiconductor chip 1, the four side sections defining the chip mount area 15 and the four side sections to define the outer peripheral part of the second semiconductor chip 2 are disposed at the same positions in an ideal state where there is no position shift. Thus, when the semiconductor device 100 is seen in plane, the side section 2A of the second semiconductor chip 2 and the side section 15A of the chip mount area 15 mean substantially the same side section.

The injection section 18 is formed on the first semiconductor chip 1 in a state where it is connected to the side section 15A of the chip mount area 15. Besides, the injection section 18 is formed into a slit shape in a direction crossing the X direction which is the wiring direction of the wiring pattern 7. One end of the injection section 18 in the Y direction is connected to the side section 15A of the chip mount area 15. Besides, in the X direction, the supply area 10 and the injection section 18 are disposed at the center (on a center line K) of the side section 15A of the chip mount area 15. The injection section 18 is formed in a state where it overlaps with the supply area 10. The injection section 18 is formed linearly (straightly) from the supply area 10 of the underfill material to the side section 15A of the chip mount area 15.

The plural (ten in the illustrated example) wiring patterns 7 disposed on the outside of the side section 15A of the chip mount area 15 are interrupted so as to align the ends of the respective wiring patterns 7, and the interrupted portions are formed as the injection section 18. Thus, the wiring patterns 7 do not exist in the injection section 18. Besides, the surface of the passivation film 8 covering those wiring patterns 7 is dented into a concave shape in the state where it continuously connects the supply area 10 of the underfill material to the side section 15A of the chip mount area 15, and the dented portion is the injection section 18. The depth (concave size) of the injection section 18 has the same size as the stepped portion 9. The planar size of the injection section 18 may be set in view of the viscosity and fluidity of the (liquid) underfill material before thermal setting used in the manufacturing process of the semiconductor device 100, the wet spread property thereof on the surface of the first semiconductor chip 1, and the like. It is desirable that the width W of the injection section 18 is not smaller than at least the film thickness of the passivation film 8. Here, as an example, the injection section 18 is formed to have a width of W=150 μm and a length of L=500 μm.

When the semiconductor device 100 having the above structure is manufactured, first, in the manufacturing process of the first semiconductor chip 1, the injection section 18 is formed on the main surface of the first semiconductor chip 1 by using the wiring patterns 7 of the uppermost layer and the passivation film 8. Besides, in the manufacturing process of the second semiconductor chip 2, plural bumps 3 are formed on the surface of the second semiconductor chip 2. The bumps 3 may be formed on the side of the first semiconductor chip 1.

Figure 6:
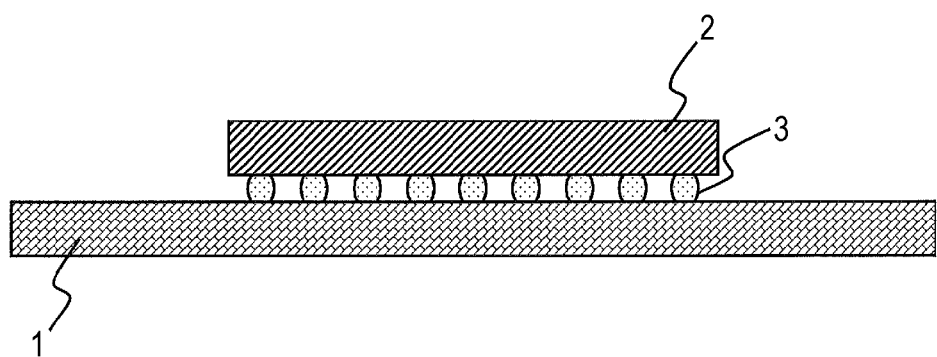
FIG. 6 is a view (No. 1) for explaining a manufacturing method of the semiconductor device according to the embodiment of the invention.

Next, the first semiconductor chip 1 obtained in the manufacturing process of the first semiconductor chip 1 and the second semiconductor chip 2 obtained in the manufacturing process of the second semiconductor chip 2 are used, and the second semiconductor chip 2 is mounted on the first semiconductor chip 1 through the bumps 3 (FIG. 6). At this time, the second semiconductor chip 2 is positioned in conformity with the chip mount area 15 set on the device formation surface of the first semiconductor chip 1, and is mounted thereon. At this stage, there occurs a state where a gap corresponding to the height of the bump 3 intervenes between the first semiconductor chip 1 and the second semiconductor chip 2.

Figure 7:
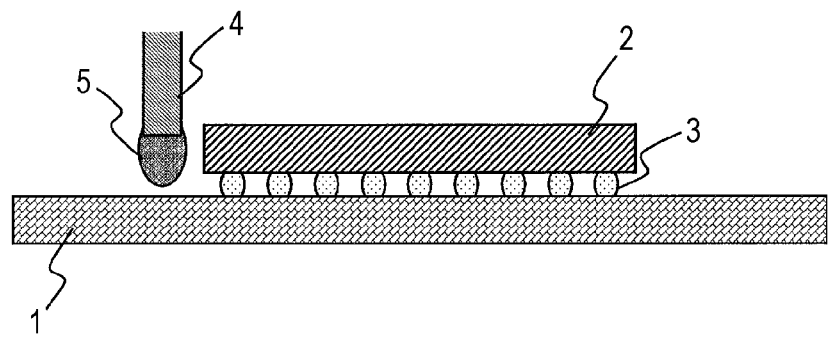
FIG. 7 is a view (No. 2) for explaining the manufacturing method of the semiconductor device according to the embodiment of the invention.
Figure 8:
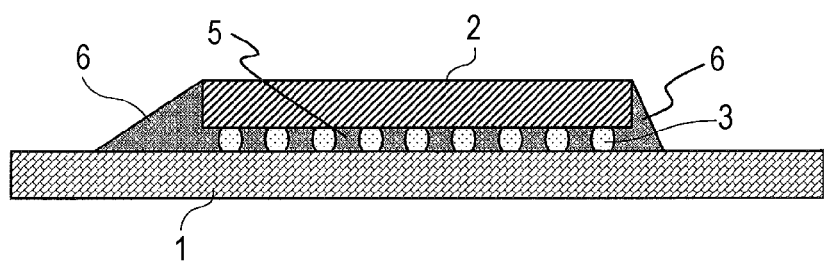
FIG. 8 is a view (No. 3) for explaining the manufacturing method of the semiconductor device according to the embodiment of the invention.

Next, as shown in FIG. 7, the underfill material 5 is supplied by dropping from the needle 4 to the supply area 10 set on the first semiconductor chip 1, and the underfill material 5 is filled between (gap) the first semiconductor chip 1 and the second semiconductor chip 2. At this time, the underfill material 5 supplied to the supply area 10 reaches the side section 2A of the second semiconductor chip 2 through the injection section 18. The injection section 18 is formed on the first semiconductor chip 1 from the supply area 10 of the underfill material to the side section 15A of the chip mount area 15 in the flat state where there is no stepped portion. Thus, the underfill material 5 supplied to the supply area 10 is guided to the side section 2A of the second semiconductor chip 2 through the injection section 18. Besides, when the underfill material 5 reaches the side section 2A of the second semiconductor chip 2, then, the underfill material 5 is drawn in between the first semiconductor chip 1 and the second semiconductor chip 2 by the capillary phenomenon and penetrates. In this way, as shown in FIG. 8, the underfill material 5 penetrating the gap between the chips forms the fillet 6 on the outer peripheral part of the second semiconductor chip 2. Thereafter, the underfill material 5 is thermally set.

In the first embodiment of the invention, the underfill material 5 supplied to the supply area 10 of the first semiconductor chip 1 is smoothly guided to the side section 2A of the second semiconductor chip 2 through the injection section 18 while the flow is not blocked by the existence of a stepped portion. Thus, as compared with the case where the underfill material 5 climbs over some step portions 9 and reaches the side section 2A of the second semiconductor chip 2, variations of the speed at which the underfill material 5 reaches the side section 2A of the second semiconductor chip 2 and the amount thereof become small. Besides, the underfill material 5 supplied to the supply area 10 reaches the side section 2A of the second semiconductor chip 2 in a shorter time, and penetrates between the chips from there by the capillary phenomenon. Thus, as compared with the underfill material 5 which wets and spreads on the first semiconductor chip 1, or the underfill material 5 which penetrates the gap between the chips, the amount of the underfill material 5 supplied to the supply area 10 is appropriately maintained. Accordingly, the underfill material 5 supplied to the supply area 10 does not climb up on the second semiconductor chip 2. As a result, the occurrence of voids and the occurrence of climbing of the underfill material can be prevented.

3. Second Embodiment

Figure 9:
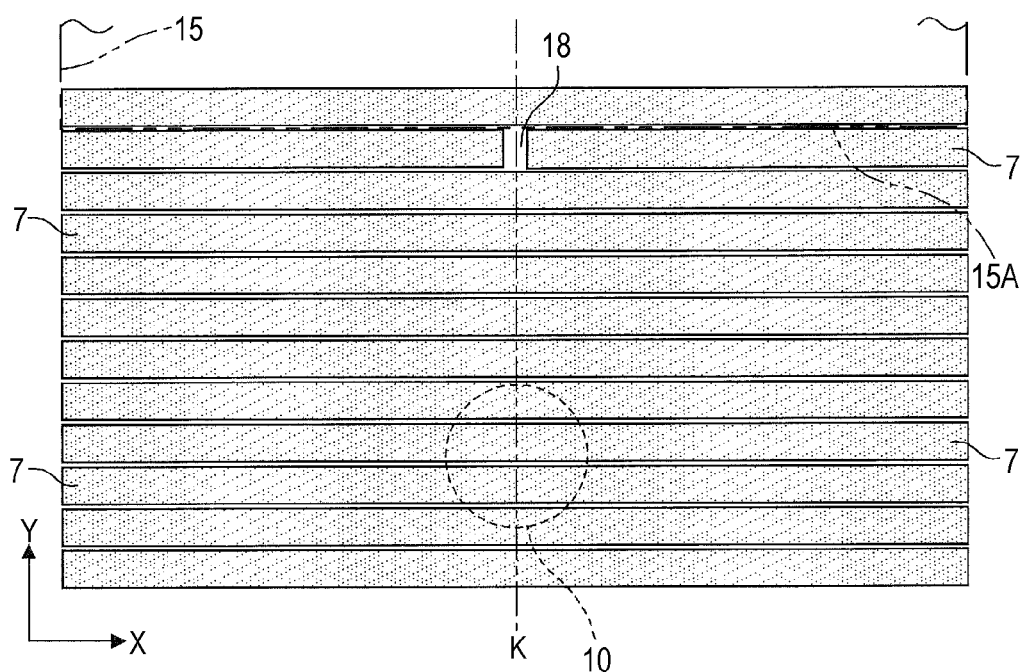
FIG. 9 is a plan view showing a structure of a semiconductor device of a second embodiment of the invention, in which a part of a device formation surface of a first semiconductor chip before a second semiconductor chip is mounted is enlarged.

FIG. 9 is a plan view showing a structure of a semiconductor device of a second embodiment of the invention, in which a part of a device formation surface of a first semiconductor chip 1 before a second semiconductor chip 2 is mounted is enlarged. This second embodiment is different from the first embodiment in the structure of an injection section 18. That is, the injection section 18 is disposed on the outside of a chip mount area 15 set on a first semiconductor chip 1 and in a state where a part of one wiring pattern 7 closest to a side section 15A of the chip mount area 15 is cut away in a slit shape. Similarly to the first embodiment, the injection section 18 is formed on the outside of the side section 15A of the chip mount area 15 on which a fillet 6 is formed to be longest. Besides, similarly to the first embodiment, the injection section 18 is formed in the slit shape and in a direction crossing the wiring direction of the wiring pattern 7. One end of the injection section 18 in the Y direction is formed in a state where it is connected to the side section 15A of the chip mount area 15.

In the second embodiment of the invention, an underfill material 5 supplied to a supply area 10 of the first semiconductor chip 1 reaches the injection section 18 in the process of wetting and spreading on the first semiconductor chip 1, and is guided to a side section 2A of the second semiconductor chip 2 through the injection section 8. Thus, as compared with the case where the injection section 18 is not formed, the underfill material 5 supplied to the supply area 10 reaches the side section 2A of the semiconductor chip 2 in a short time, and penetrates between the chips from there by the capillary phenomenon. Accordingly, the occurrence of voids and the occurrence of climbing of the underfill material can be prevented.

4. Third Embodiment

Figure 10:
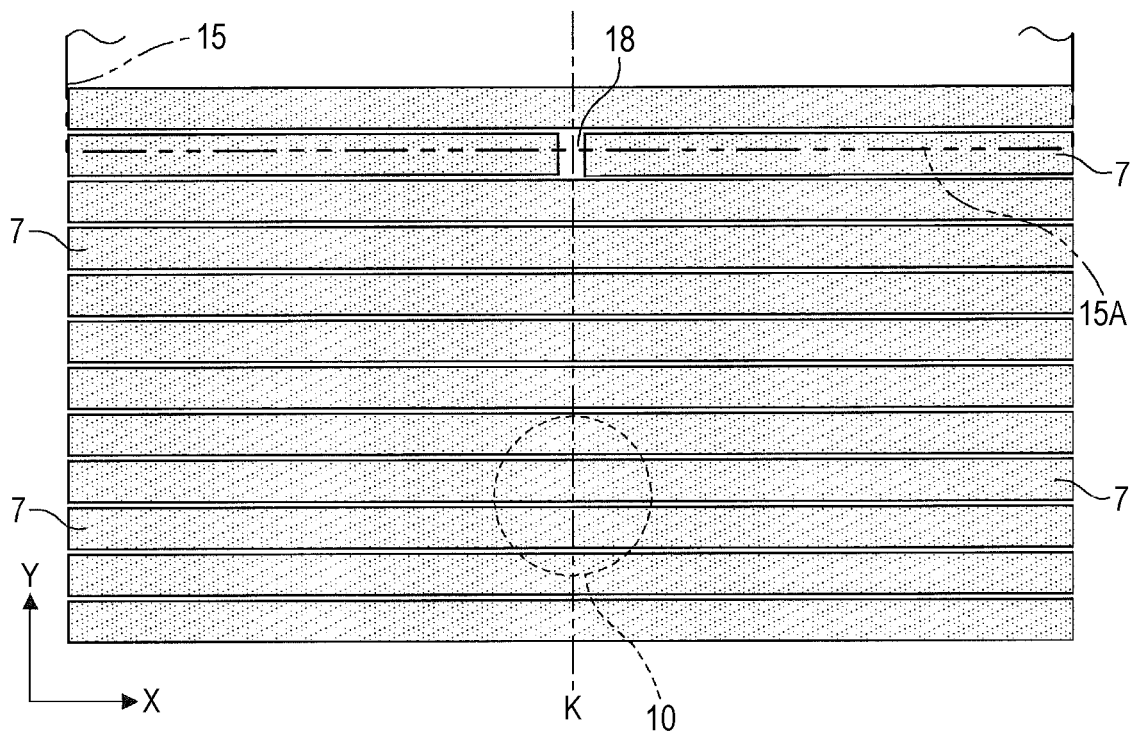
FIG. 10 is a plan view showing a structure of a semiconductor device of a third embodiment of the invention, in which a part of a device formation surface of a first semiconductor chip before a second semiconductor chip is mounted is enlarged.

FIG. 10 is a plan view showing a structure of a semiconductor device of a third embodiment of the invention, in which a part of a device formation surface of a first semiconductor chip 1 before a second semiconductor chip 2 is mounted is enlarged. This third embodiment is different from the second embodiment in a positional relation between a side section 15A of a chip mount area 15 and an injection section 18. That is, in the second embodiment, the one end of the injection section 18 is positioned in conformity with the side section 15A of the chip mount area 15 and is disposed. However, in the third embodiment, the injection section 18 is disposed in the state where it crosses the side section 15A of the chip mount area 15. The form in which the injection section 18 crosses the side section 15A of the chip mount area 15 is realized by disposing, in the Y direction, one end of the injection section 18 on the inside of the chip mount area 15 and disposing the other end of the injection section 18 on the outside of the chip mount area 15.

In the third embodiment, an underfill material 5 supplied to a supply area 10 of the first semiconductor chip 1 reaches the injection section 18 in the process of wetting and spreading on the first semiconductor chip 1, and is guided to a side section 2A of the second semiconductor chip 2 through the injection section 18. At that time, the underfill material 5 reaching the injection section 18 is guided through the injection section 18 to the inside of the chip mount area 15, that is, the inside of the area where the first semiconductor chip 1 and the second semiconductor chip 2 face each other. Thus, in addition to the same effect as the second embodiment, the following effect can be obtained. That is, drawing of the underfill material 5 by the capillary phenomenon can be accelerated by the existence of the injection section 18. Besides, with respect to the chip mount area 15 set on the first semiconductor chip 1, even when the mount position of the second semiconductor chip 2 is shifted within the manufacture tolerance, the underfill material 5 can be certainly guided to between the chips through the injection section 18.

Figure 11:
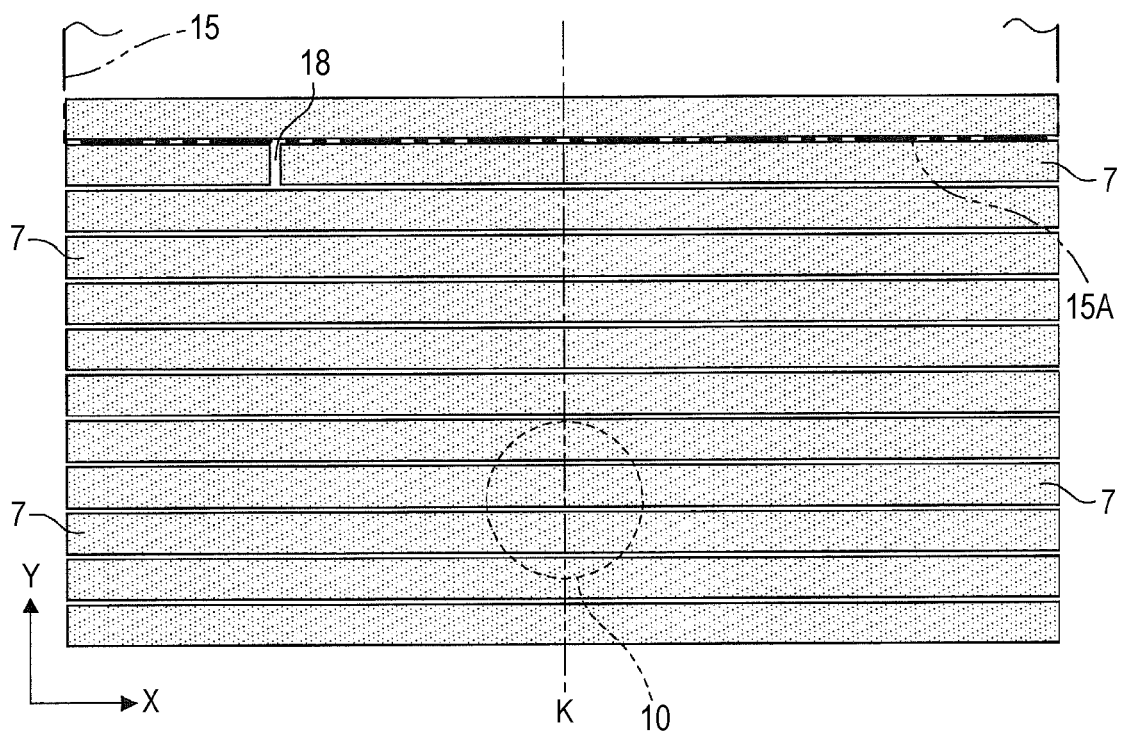
FIG. 11 is a view showing another structure of the semiconductor device of the third embodiment of the invention.

Incidentally, in the third embodiment, although the injection section 18 is formed at the center of the side section 2A of the second semiconductor chip 2 in the X direction, no limitation is made to this. For example, as shown in FIG. 11, the injection section 18 may be formed at a position shifted from the center of the side section 2A of the second semiconductor chip 2 in the X direction. That is, as long as the injection section 18 is in the state where one end of the injection section 18 is connected to or crosses the side section 15A of the chip mount area 15, the injection section 18 may be formed at any position in the X direction within the range of the side section 15A of the chip mount area 15. The same point applies to the first embodiment and the second embodiment.

5. Fourth Embodiment

Figure 12:
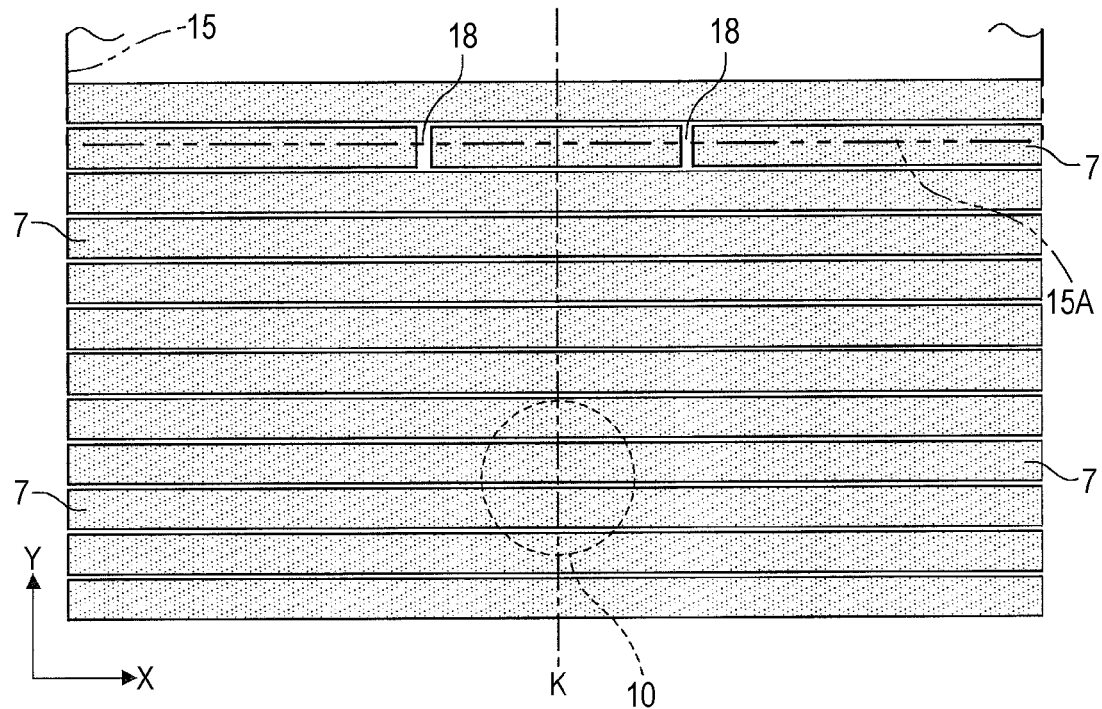
FIG. 12 is a plan view showing a structure of a semiconductor device of a fourth embodiment of the invention, in which a part of a device formation surface of a first semiconductor chip before a second semiconductor chip is mounted is enlarged.

FIG. 12 is a plan view showing a structure of a semiconductor device of a fourth embodiment of the invention, in which a part of a device formation surface of a first semiconductor chip 1 before a second semiconductor chip 2 is mounted is enlarged. The fourth embodiment is different from the first to third embodiments in the number of injection sections 18. That is, in the first to third embodiments, only one injection section 18 is formed. However, in the fourth embodiment, two injection sections 18 are formed at positions shifted in the X direction. The two injection sections 18 are disposed at positions which are respectively spaced by an equal distance from the center of a side section 15A of a chip mount area 15 in the X direction. Besides, each of the injection sections 18 is formed in the state where it crosses the side section 15A of the chip mount area 15.

In the fourth embodiment of the invention, an underfill material 5 supplied to a supply area 10 of the first semiconductor chip 1 reaches the respective injection sections 18 in the process of wetting and spreading on the first semiconductor chip 1. Then, the underfill material 5 is guided to the side section 2A of the second semiconductor chip 2 through the respective injection sections 8. By this, the underfill material 5 is injected between the chips at the side section 15A of the chip mount area 15 and simultaneously at the plural places. Thus, the occurrence of voids and climbing can be effectively prevented.

6. Fifth Embodiment

Figure 13:
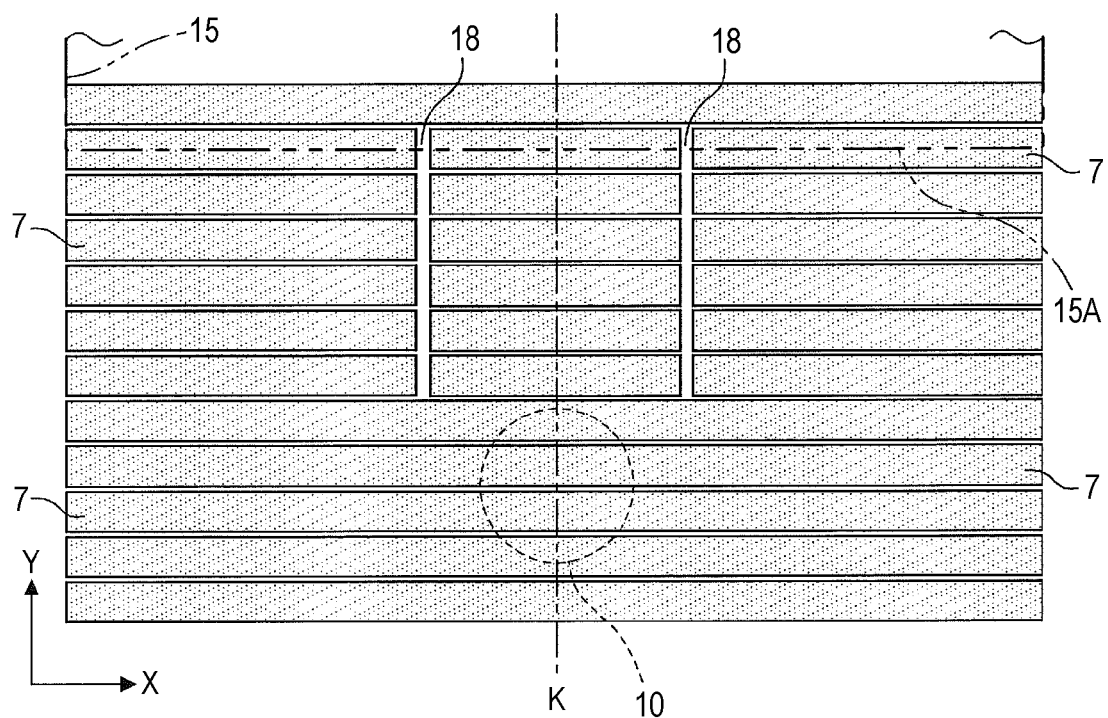
FIG. 13 is a plan view showing a structure of a semiconductor device of a fifth embodiment of the invention, in which a part of a device formation surface of a first semiconductor chip before a second semiconductor chip is mounted is enlarged.

FIG. 13 is a plan view showing a structure of a semiconductor device of a fifth embodiment of the invention, in which a part of a device formation surface of a first semiconductor chip 1 before a second semiconductor chip 2 is mounted is enlarged. The fifth embodiment is different from the fourth embodiment in the length of an injection section 18 in the Y direction. That is, in the fourth embodiment, one wiring pattern 7 is cut away in a slit shape at two places in the X direction, and the two injection sections 18 are formed. On the other hand, in the fifth embodiment, plural wiring patterns 7 arranged in the Y direction are respectively cut away in a slit shape at two places in the X direction, and two injection sections 18 are formed into long thin groove shapes. In the illustrated example, although six wiring patterns 7 are cut away in slit shapes, the number of the wiring patterns 7 cut away in slit shapes is not limited six, but may be two or more and five or less, or seven or more.

In the fifth embodiment of the invention, the underfill material 5 supplied to a supply area 10 of the first semiconductor chip 1 reaches the respective injection sections 18 in the process of wetting and spreading on the first semiconductor chip 1. In this case, each of the injection sections 18 is formed linearly to the side section 15A of the chip mount area 15 in the state where it crosses the plural wiring patterns 7. Thus, the underfill material 5 wetting and spreading from the supply area 10 reaches the respective injection sections 18 more quickly than the fourth embodiment. Then, the underfill material 5 reaching the respective injection sections 18 is quickly guided to the side section 2A of the second semiconductor chip 2 along the injection sections 18. Accordingly, the occurrence of voids and climbing can be effectively prevented.

Incidentally, in the fourth embodiment and the fifth embodiment, although the injection sections 18 are formed in the state where they cross the side section 15A of the chip mount area 15, the invention is not limited to this. For example, similarly to the first embodiment and the second embodiment, the injection section 18 may be formed in the state where one end of the injection section 18 is connected to the side section 15A of the chip mount area 15.

Besides, in the fourth embodiment and the fifth embodiment, although the two injection sections 18 are formed, three or more injection sections 18 may be formed. Besides, when three injection sections 18 are formed, it is desirable to adopt the form in which one injection section 18 is disposed at the center of the side section 15A of the chip mount area 15 in the X direction, and the other injection sections 18 are disposed at positions which are respectively spaced from the center by an equal distance.

7. Sixth Embodiment

Figure 14:
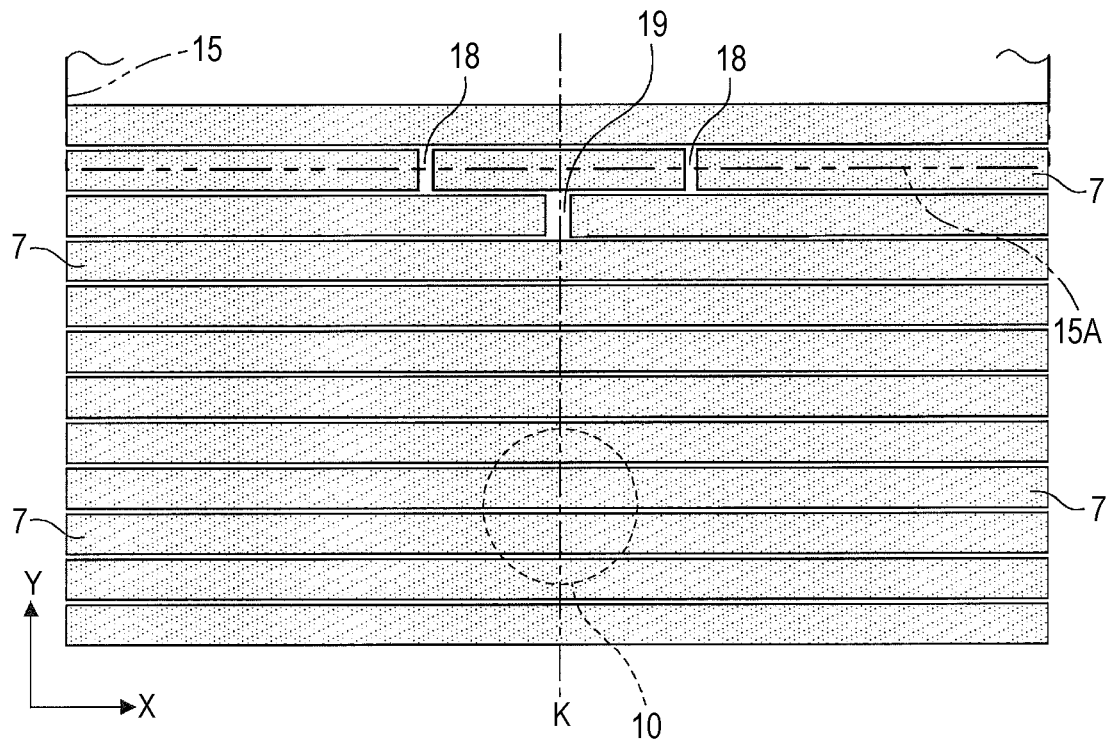
FIG. 14 is a plan view showing a structure of a semiconductor device of a sixth embodiment of the invention, in which a part of a device formation surface of a first semiconductor chip before a second semiconductor chip is mounted is enlarged.
Figure 15:
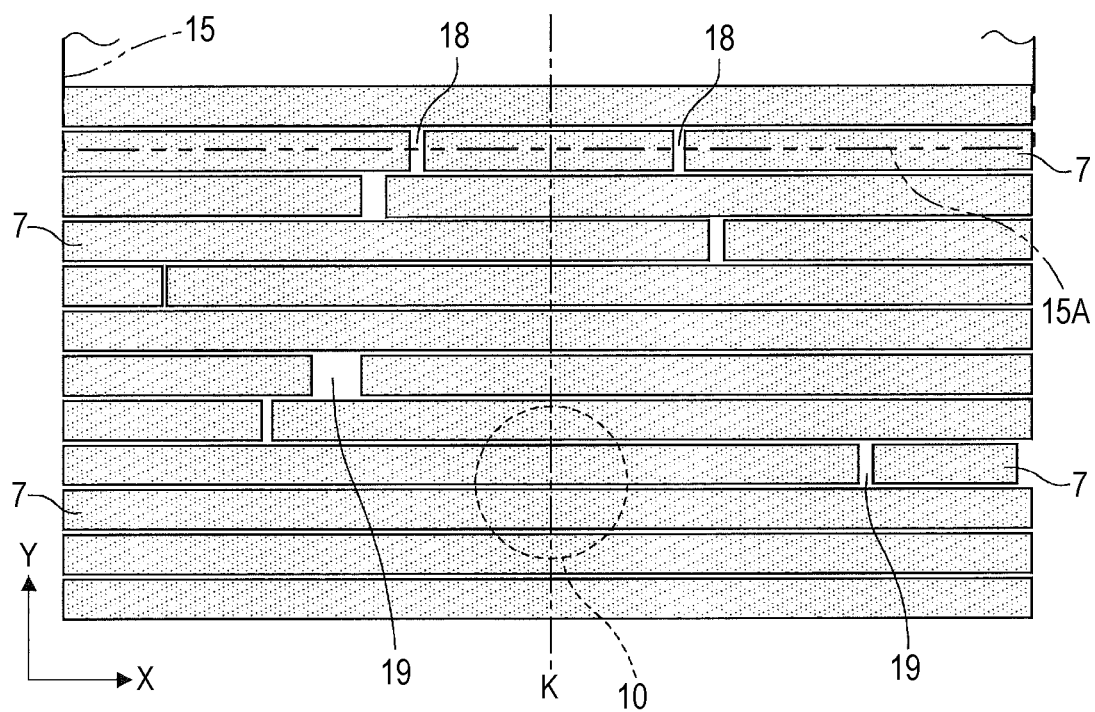
FIG. 15 is a view showing another structure of the semiconductor device of the sixth embodiment of the invention.

FIG. 14 is a plan view showing a structure of a semiconductor device of a sixth embodiment of the invention, in which a part of a device formation surface of a first semiconductor chip 1 before a second semiconductor chip 2 is mounted is enlarged. The sixth embodiment is different from the fourth embodiment in that an auxiliary injection section 19 is formed on the outside of a side section 15A of a chip mount area 15 and in a state (separate state) where it is not connected to the side section 15A. Similarly to the injection section 18, the auxiliary injection section 19 is formed in a state where a part of a wiring pattern 7 is cut away in a slit shape. The auxiliary injection section 19 is formed to assist when an underfill material 5 is injected between the chips through the injection section 18. The auxiliary injection section 19 functions to locally accelerate the flow of the underfill material 5 in the Y direction when the underfill material 5 supplied to a supply area 10 wets and spreads on the first semiconductor chip 1. The auxiliary injection section 19 may be formed at one arbitrary place in the X direction and the Y direction. Besides, for example, as shown in FIG. 15, the auxiliary injection sections may be formed at arbitrary plural places. Besides, the slit width of each of the auxiliary injection sections 19 may be changed arbitrarily.

In the sixth embodiment of the invention, the underfill material 5 supplied to the supply area 10 of the first semiconductor chip 1 reaches more quickly the injection section 18 and the side section 2A of the second semiconductor chip 2 connected thereto via the auxiliary injection section 19. Thus, as compared with the case where the auxiliary injection section 19 is not formed, the underfill material 5 can be made to reach the side section 2A of the second semiconductor chip 2 in a short time.

8. Seventh Embodiment

Figure 16:
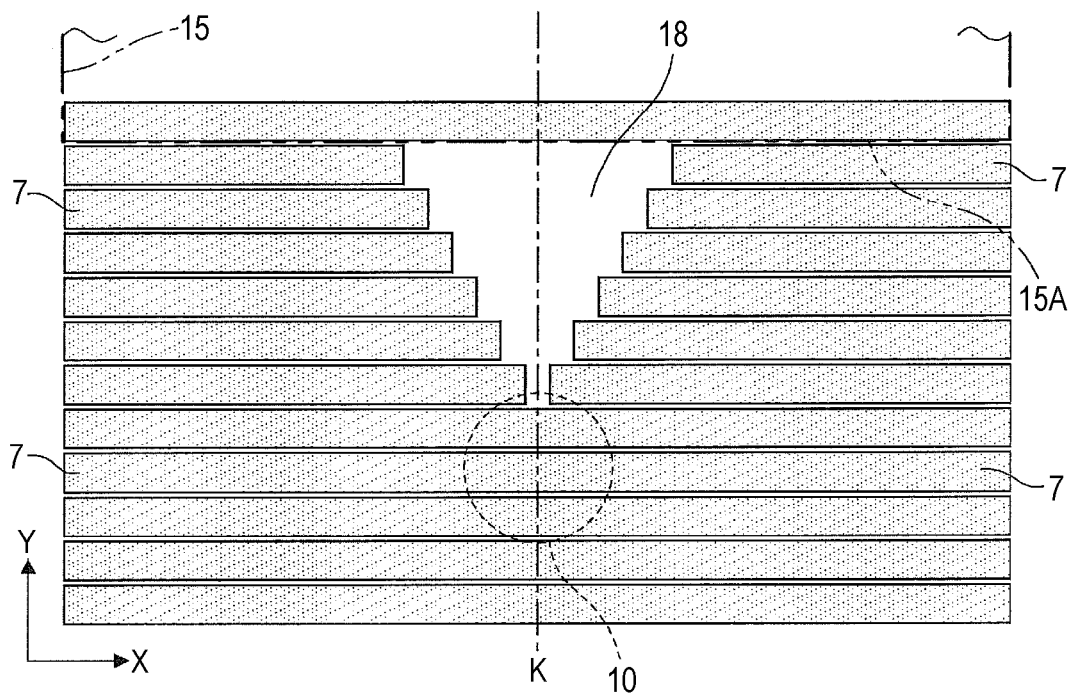
FIG. 16 is a plan view showing a structure of a semiconductor device of a seventh embodiment of the invention, in which a part of a device formation surface of a first semiconductor chip before a second semiconductor chip is mounted is enlarged.

FIG. 16 is a plan view showing a structure of a semiconductor device of a seventh embodiment of the invention, in which a part of a device formation surface of a first semiconductor chip 1 before a second semiconductor chip 2 is mounted is enlarged. The seventh embodiment is different from the first embodiment in plane shape of an injection section 18. That is, in the first embodiment, the injection section 18 is formed linearly. However, in the seventh embodiment, the injection section 18 is formed in a folding-fan shape. In more detail, the injection section 18 is formed on the first semiconductor chip 1 and in the folding-fan shape toward a side section 15A of a chip mount area 15 from a supply area 10 where an underfill material 5 is supplied. The folding-fan shape is realized in such a way that a wiring pattern 7 on the outside of the side section 15A of the chip mount area 15 and closest to the side section 15A is most widely cut away, and the cut width of a wiring pattern 7 positioned more remotely therefrom is made narrower. Although the number of wiring patterns 7 forming the folding-fan shape injection section 18 is six in the Y direction in the illustrated example, no limitation is made to this. The number may be two or more and five or less, or may be seven or more. Besides, in the X direction, it is desirable that the injection section 18 is formed in the folding-fan shape at the center of the side section 15A of the chip mount area 15.

In the seventh embodiment of the invention, in addition to the same effect as the first embodiment, the following effect is obtained. That is, the underfill material 5 supplied to the supply area 10 of the first semiconductor chip 1 reaches the injection section 18 in the process of wetting and spreading on the first semiconductor chip 1. At this time, the underfill material 5 reaching the injection section 18 flows in the injection section 18 from the cut portion of the most narrowly cut wiring pattern 7 to the cut portion of the most widely cut wiring pattern 7. Thus, the flow of the underfill material 5 in the injection section 18 becomes smooth. Besides, in the process where the underfill material is guided from the injection section 18 to the side section 2A of the second semiconductor chip 2, the underfill material 5 penetrates between the chips from the start point of the wide width portion of the injection section 18. Thus, the underfill material 5 can be quickly penetrated between the first semiconductor chip 1 and the second semiconductor chip 2.

Incidentally, in FIG. 16, the most widely cut wiring pattern 7 is disposed along the side section 15A of the chip mount area 15, and a part of the injection section 18 is connected to the side section 15A of the chip mount area 15. However, the invention is not limited to this. For example, although not shown, a form may be adopted in which the most widely cut wiring pattern 7 is disposed to overlap with the side section 15A of the chip mount area 15, and a part of the injection section 18 crosses the side section 15A of the chip mount area 15.

9. Eighth Embodiment

Figure 17:
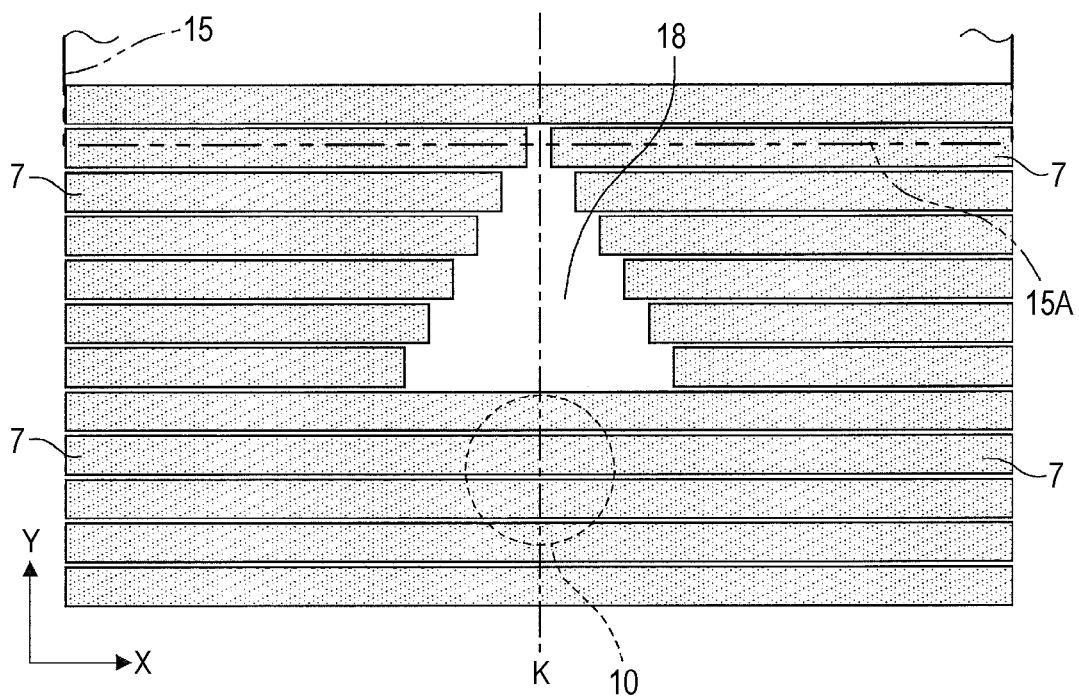
FIG. 17 is a plan view showing a structure of a semiconductor device of an eighth embodiment of the invention, in which a part of a device formation surface of a first semiconductor chip before a second semiconductor chip is mounted is enlarged.

FIG. 17 is a plan view showing a structure of a semiconductor device of an eighth embodiment of the invention, in which a part of a device formation surface of a first semiconductor chip 1 before a second semiconductor chip 2 is mounted is enlarged. The eighth embodiment is different from the seventh embodiment in the plane shape of an injection section 18. That is, in the seventh embodiment, the injection section 18 is formed on the first semiconductor chip 1 and in the folding-fan shape toward the side section 15A of the chip mount area 15 from the supply area 10 where the underfill material 5 is supplied. On the other hand, in the eighth embodiment, the injection section 18 is formed on the first semiconductor chip 1 and in a taper shape (tapered shape) toward a side section 15A of a chip mount area 15 from a supply area 10 where an underfill material 5 is supplied. The taper shape is realized in such a way that a wiring pattern 7 on the outside of the side section 15A of the chip mount area 15 and closest to the side section 15A is most narrowly cut away, and the cut width of a wiring pattern 7 positioned more remotely therefrom is made wider. Although the number of the wiring patterns 7 forming the taper shape injection section 18 is six in the Y direction in the illustrated example, no limitation is made to this, and the number may be two or more and five or less, or seven or more. Besides, in the X direction, it is desirable that the injection section 18 is formed in the taper shape at the center of the side section 15A of the chip mount area 15.

In the eighth embodiment of the invention, in addition to the same effect as the first embodiment, the following effect can be obtained. That is, the underfill material 5 supplied to the supply area 10 of the first semiconductor chip 1 reaches the injection section 18 in the process of wetting and spreading on the first semiconductor chip 1. At this time, the underfill material 5 reaching the injection section 18 flows in the injection section 18 from the cut portion of the most widely cut wiring pattern 7 to the cut portion of the most narrowly cut wiring pattern 7. Thus, the speed of the underfill material flowing in the injection section 18 becomes high. Accordingly, the underfill material 5 reaching the injection section 18 can be quickly guided to the side section 2A of the second semiconductor chip 2.

Incidentally, in FIG. 17, the most narrowly cut wiring pattern 7 is disposed to overlap with the side section 15A of the chip mount area 15, and a part of the injection section 18 is made to cross the side section 15A of the chip mount area 15. However, the invention is not limited to this. For example, although not shown, a form may be adopted in which the most narrowly cut wiring pattern 7 is disposed along the side section 15A of the chip mount area 15, and a part of the injection section 18 is connected to the side section 15A of the chip mount area 15.

10. Ninth Embodiment

Figure 18:
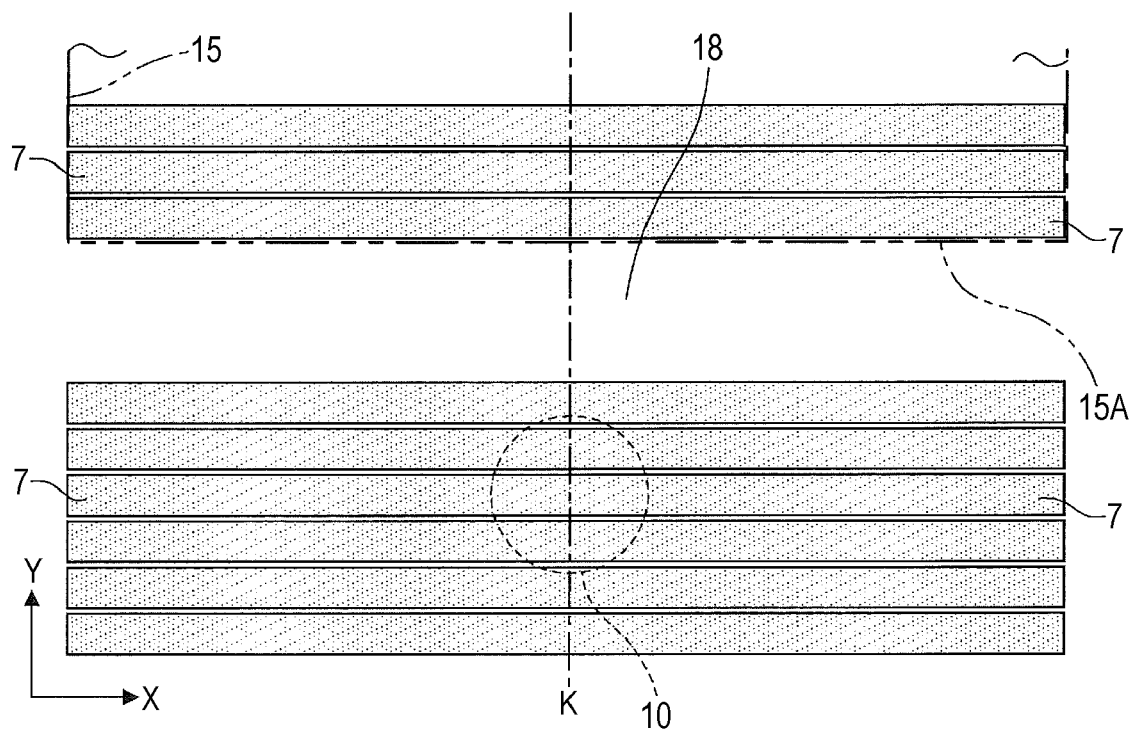
FIG. 18 is a plan view showing a structure of a semiconductor device of a ninth embodiment of the invention, in which a part of a device formation surface of a first semiconductor chip before a second semiconductor chip is mounted is enlarged.
Figure 19:
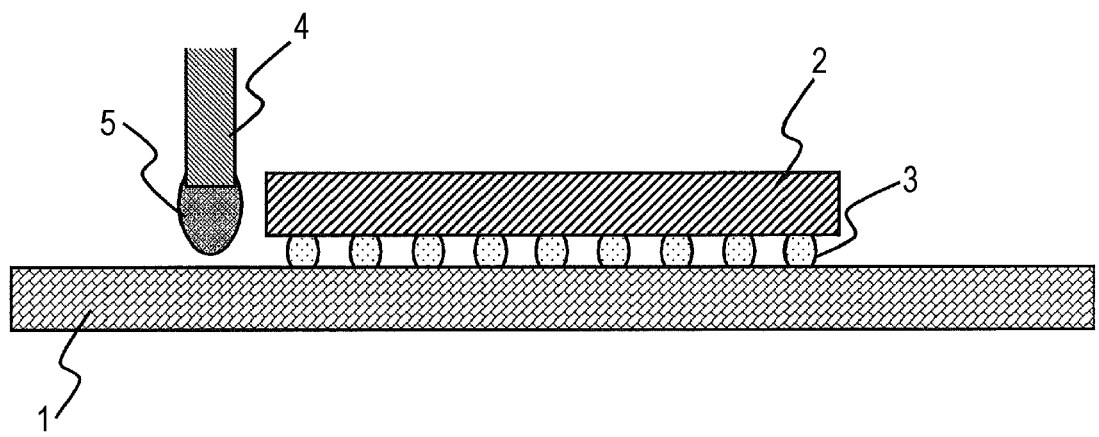
FIG. 19 is a view showing an example of a filling process of an underfill material.
Figure 20A:
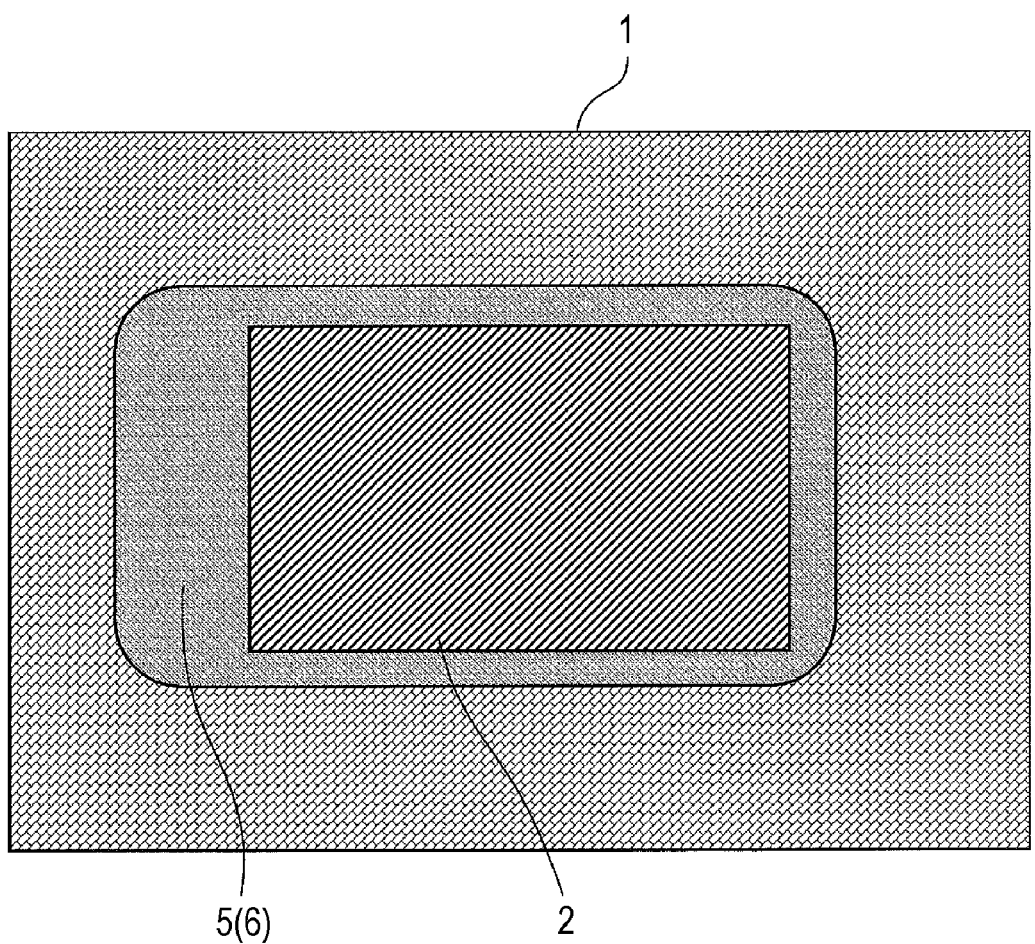
FIGS. 20A and 20B are views in which a fillet is formed by the filling of the underfill material.
Figure 20B:
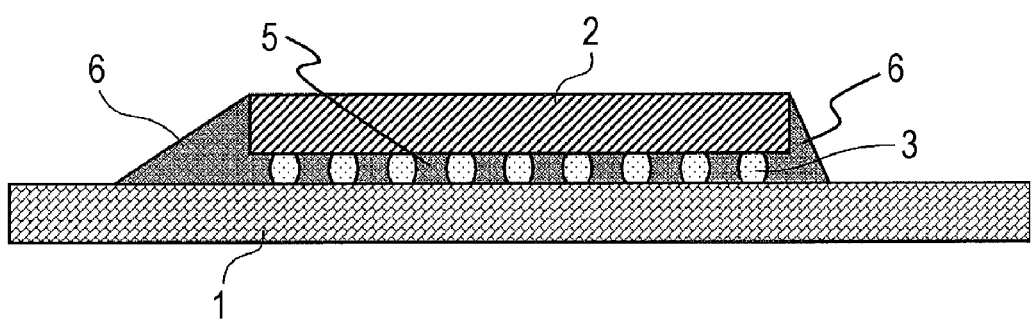
Figure 21:
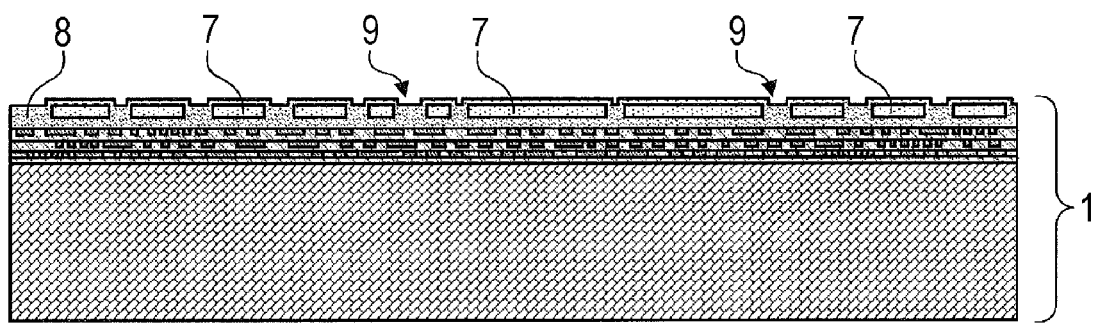
FIG. 21 is a view showing a sectional structure of a semiconductor chip.
Figure 22:
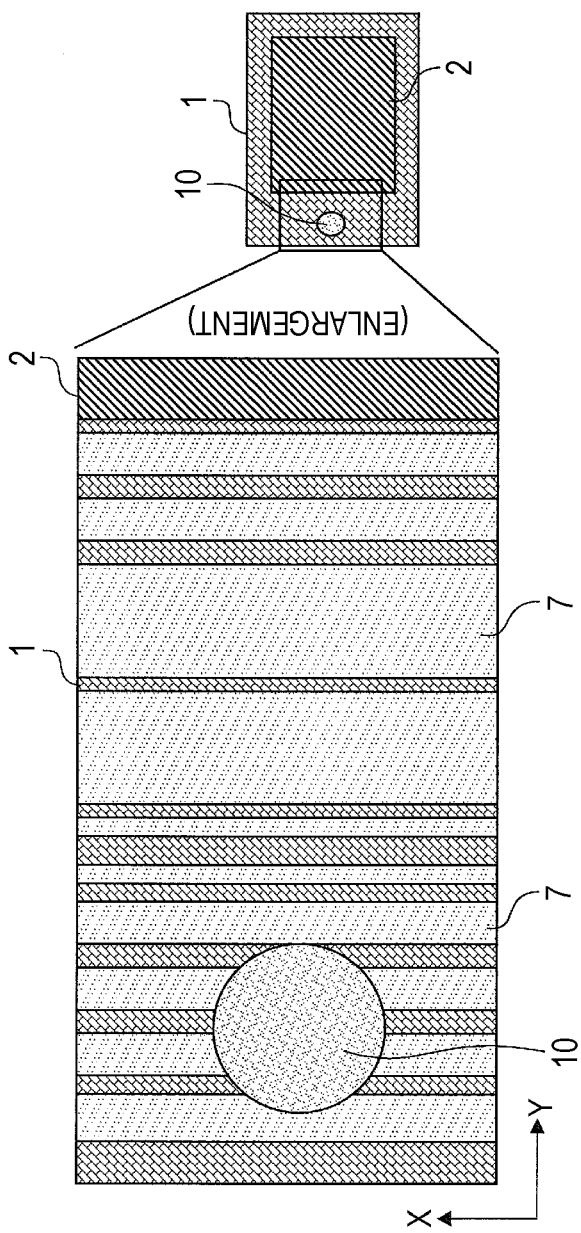
FIGS. 22A to 22C are views showing a supply area of an underfill material and a surface state of a semiconductor chip.
Figure 23:
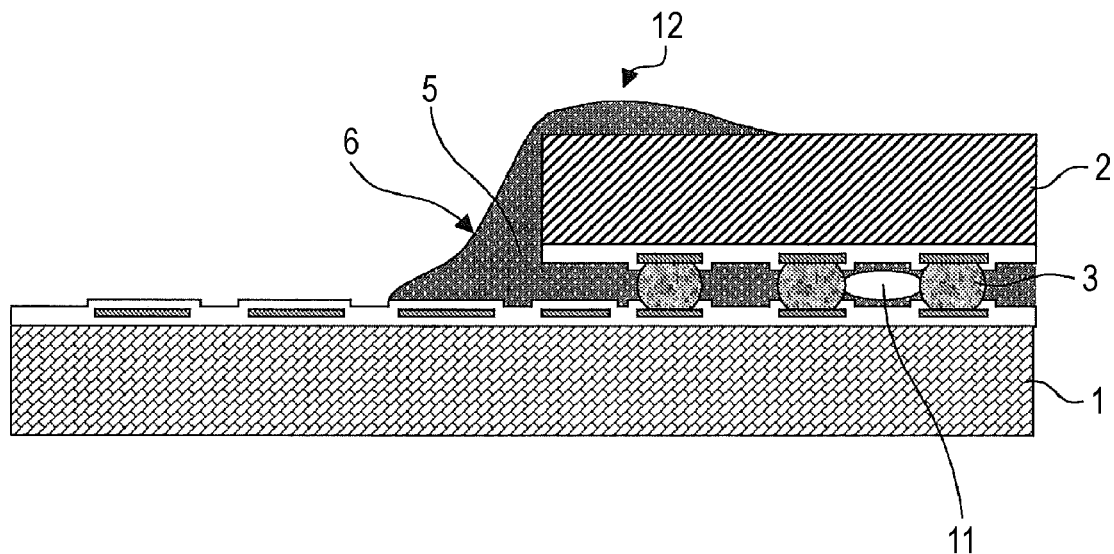
FIG. 23 is a view (No. 1) for explaining a related art problem.
Figure 24:
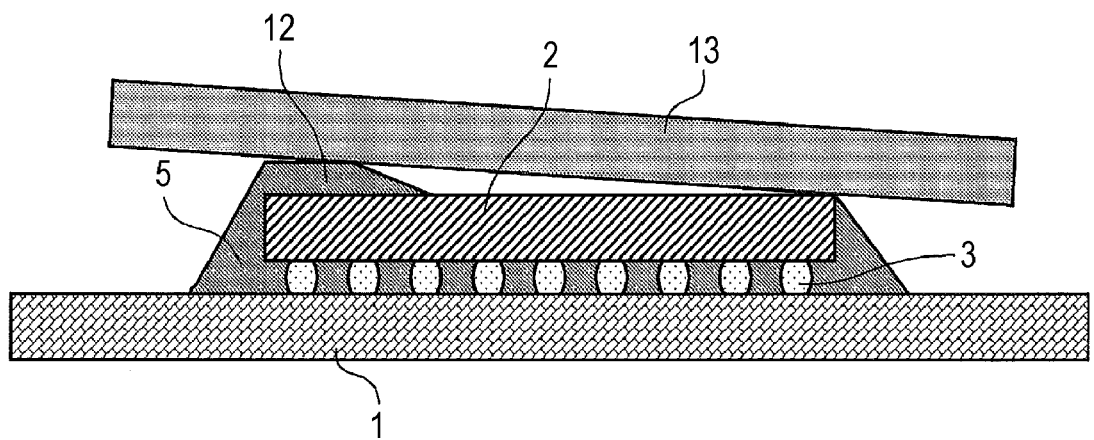
FIG. 24 is a view (No. 2) for explaining a related art problem.

FIG. 18 is a plan view showing a structure of a semiconductor device of a ninth embodiment of the invention, in which a part of a device formation surface of a first semiconductor chip 1 before a second semiconductor chip 2 is mounted is enlarged. In the ninth embodiment, an injection section 18 is formed in a state where it is connected to an entire (all area) of a side section 15A of a chip mount area 15 in the X direction which is the wiring direction of a wiring pattern 7. It is desirable that the size of the injection section 18 in the Y direction is at least ⅓ of the chip thickness of the second semiconductor chip 2. Besides, the maximum value (upper limit value) of the size of the injection section 18 in the Y direction may be regulated under, for example, a condition where the supply area 10 of the underfill material is completely contained in the injection section 18. Specifically, the maximum value of the size of the injection section 18 in the Y direction may be regulated by a value obtained by adding the size (outer diameter) of the supply area 10 to a separate distance from the side section 15A of the chip mount area 15 to the supply area 10 of the underfill material.

In the ninth embodiment of the invention, the underfill material 5 supplied to the supply area 10 of the first semiconductor chip 1 reaches the injection section 18 in the process of wetting and spreading on the first semiconductor chip 1. At this time, when the injection section 18 is formed in the state where the injection section is connected to the entire of the side section 15A of the chip mount area 15, the underfill material 5 reaching the injection section 18 is not blocked and is guided to the side section 2A of the second semiconductor chip 2 through the wide injection section 18. Besides, the underfill material 5 is injected between the chips from the whole area of the side section 2A of the semiconductor chip 2 by the capillary phenomenon. Thus, the occurrence of voids and climbing can be effectively prevented.

Incidentally, in FIG. 18, one end of the injection section 18 in the Y direction is disposed along the side section 15A of the chip mount area 15, and the injection section 18 is connected to the side section 15A of the chip mount area 15. However, the invention is not limited to this. For example, although not shown, a form may be adopted in which one end side of the injection section 18 in the Y direction is disposed to overlap with the side section 15A of the chip mount area 15, and the injection section 18 is made to cross the side section 15A of the chip mount area 15.

The present application contains subject matter related to that disclosed in Japanese Priority Patent Application JP 2009-010786 filed in the Japan Patent Office on Jan. 21, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
   a mounted body in which a wiring pattern is formed on a first main surface;
   a semiconductor chip mounted on the first main surface of the mounted body;
   an underfill material filled between the mounted body and the semiconductor chip;
   a fillet formed by the underfill material and comprising four sections, each of which extends from one side face of the semiconductor chip for a distance; and
   an injection section disposed on the mounted body and on one section of the fillet with the longest distance is formed
   wherein,
      the injection section guides the underfill material to be filled between the mounted body and the semiconductor chip, and
      the injection section extends in a direction that is orthogonal to the side face of the semiconductor chip from which the fillet section with the longest distance extends.

2. The semiconductor device according to claim 1, wherein the injection section is disposed in a state where the injection section is connected to or crosses the side face of the semiconductor chip from which the fillet section with the longest distance extends.

3. The semiconductor device according to claim 2, wherein:
   the wiring pattern is disposed on the fillet section with the longest distance and in parallel to the side face of the semiconductor chip from which the fillet section with the longest distance extends, and
   the injection section is disposed in a state where the injection section is connected to or crosses part of the side face of the semiconductor chip from which the fillet section with the longest distance extends in a wiring direction of the wiring pattern.

4. The semiconductor device according to claim 3, wherein the injection section has a slit shape in a direction crossing the wiring direction of the wiring pattern.

5. The semiconductor device according to claim 4, wherein a plurality of the slit-like injection sections are disposed while positions are shifted in the wiring direction of the wiring pattern.

6. The semiconductor device according to one of claims 1 to 3, wherein the injection section has a linear shape toward the side face of the semiconductor chip from which the fillet section with the longest distance extends.

7. The semiconductor device according to one of claims 1 to 3, wherein the injection section has a folding-fan shape toward the side face of the semiconductor chip from which the fillet section with the longest distance extends.

8. The semiconductor device according to one of claims 1 to 3, wherein the injection section has a taper shape toward the side face of the semiconductor chip from which the fillet section with the longest distance extends.

9. The semiconductor device according to claim 2, wherein:
   the wiring pattern is disposed on the fillet section with the longest distance and in parallel to the side face of the semiconductor chip from which the fillet section with the longest distance extends, and
   the injection section is disposed in a state where the injection section is connected to or crosses the entire side face of the semiconductor chip from which the fillet section with the longest distance extends in a wiring direction of the wiring pattern.

10. A manufacturing method of a semiconductor device, comprising the steps of:
    mounting a semiconductor chip on a mounted body in which a wiring pattern is formed on a first main surface;
    filling an underfill material between the mounted body and the semiconductor chip to form a fillet on an outer peripheral part of the semiconductor chip; and
    forming, before the mounting step, an injection section on the mounted body and outside one side face of the semiconductor chip which is closest to a supply area where the underfill material is supplied, and guiding, in the filling step, the underfill material to be filled between the mounted body and the semiconductor chip by using the injection section,
    wherein,
       the injection section extends in a direction that is orthogonal to the side face of the semiconductor chip which is closest to the supply area.

* * * * *